United States Patent [19]
Backasch et al.

[11] Patent Number: 5,799,393
[45] Date of Patent: Sep. 1, 1998

[54] METHOD FOR PRODUCING A PLATED-THROUGH HOLE ON A PRINTED-CIRCUIT BOARD

[75] Inventors: Wolf Backasch, Hildesheim; Rolf Hohmann, Salzdetfurth, both of Germany

[73] Assignee: Blaupunkt-Werke GmbH, Hildesheim, Germany

[21] Appl. No.: 669,330
[22] PCT Filed: Oct. 27, 1995
[86] PCT No.: PCT/DE95/01497
  § 371 Date: Sep. 23, 1996
  § 102(e) Date: Sep. 23, 1996
[87] PCT Pub. No.: WO96/15651
  PCT Pub. Date: May 23, 1996

[30] Foreign Application Priority Data

Nov. 9, 1994 [DE] Germany ............ 44 39 948

[51] Int. Cl.$^6$ ........................ H04K 3/10
[52] U.S. Cl. .............. 29/852; 174/266; 427/97
[58] Field of Search ............ 29/852, 840; 427/97; 174/266; 428/98, 96

[56] References Cited

U.S. PATENT DOCUMENTS

| | | | |
|---|---|---|---|
| 3,571,923 | 3/1971 | Shaheen et al. | 174/266 X |
| 3,691,632 | 9/1972 | Smith | 174/266 X |
| 4,179,800 | 12/1979 | Takaba et al. | 427/97 X |
| 4,512,829 | 4/1985 | Ohta et al. | 29/852 |
| 4,870,751 | 10/1989 | Antoon | 29/852 X |
| 5,218,761 | 6/1993 | Maniwa et al. | 174/266 X |
| 5,276,290 | 1/1994 | Bladon | 174/266 X |
| 5,309,632 | 5/1994 | Takahashi et al. | 29/852 |
| 5,539,181 | 7/1996 | Sippel | 174/266 |

FOREIGN PATENT DOCUMENTS

| | | | |
|---|---|---|---|
| 981 808 | 1/1976 | Canada | 174/266 |
| 47-34179 | 8/1972 | Japan | 29/852 |
| 1-264290 | 10/1989 | Japan . | |
| 59996 | 3/1971 | United Kingdom | 174/266 |
| 1303851 | 1/1973 | United Kingdom | 174/266 |
| 1396481 | 6/1975 | United Kingdom . | |
| 2118369 | 10/1983 | United Kingdom . | |

*Primary Examiner*—Carl J. Arbes

[57] ABSTRACT

A method for producing a plated-through hole on a printed-circuit board, whereby the printed-circuit board is initially bored, catalyzed, and patterned. The plated-through hole is then fashioned in an electrochemical deposition process so as to make it functional for the through-hole mounting of electrical components. The plating process is preferably carried out with nickel or nickel compounds, so that no additional corrosion protection is required. A direct bonding to the contact lands can be achieved by coating the contact lands with gold or palladium.

9 Claims, 4 Drawing Sheets

METHOD FOR PRODUCING A PLATED-THROUGH HOLE ON A PRINTED-CIRCUIT BOARD

FIELD OF THE INVENTION

The present invention related to a method for producing a plated-through hole on a printed-circuit board. In producing a plated-through hole on a multilayer printed-circuit board, it is possible to initially bore (drill) through the copper-clad printed-circuit board at the spots provided for the through-hole plating and, using a galvanic process, to plate (metallize) the inner wall of the bore through copper deposition. In so doing, the copper is not only deposited on the inner wall of the bore, but over the entire copper surface. The plated bores and the spots which will later form the interconnect traces (conductor lines) are subsequently coated with an etch resist or resist film. The uncoated copper surfaces are etched out, so that after removal of the etch resist, the desired interconnect traces, as well as the plated plated-through holes remain. When the inner wall is plated, copper is inevitably deposited on the copper surfaces of the printed-circuit board as well. However, this additional copper must later be removed again during the etching process, thus making the process for manufacturing the printed-circuit board more expensive. Another conventional method is used to imprint a conductive paste on an uncoated printed-circuit board using the screen printing technique, which at the same time fills in the bores, thus forming a plated-through hole. However, the disadvantage associated with this conventional method is that the plated-through hole provided for receiving a lead wire of an electrical component can no longer be used under the method of through-hole mounting, since the bores are sealed by the conductive paste. Additional bores must then be provided to insert the lead wires of the components. However, additional bores require additional space, which is not always available, particularly given a multilayer circuit wiring on the printed-circuit board.

SUMMARY OF THE INVENTION

The advantage of the method according to the present invention is that no additional metal is deposited on the copper-clad printed-circuit board that would then have to be etched away again. Another advantage is that the plated-through holes can be used for the through-hole mounting of the lead wires of the components, making it possible to omit additional bores and, thus, economize space on the printed-circuit board. In addition, the process for fabricating such a printed-circuit board is simplified, so that a cost saving is also realized.

According to another embodiment of the present invention, it is also advantageous that the catalyst is applied either after the boring operation or after the patterning of the printed-circuit board. As a result, the metal can be applied directly to the catalyst during the subsequent electrochemical plating without having to activate said catalyst once more.

It is further advantageous that the electrochemical plating is applied as such a thin-walled plating so as to leave open the remaining bore section, enabling the bore section to still receive the lead wires of the components.

Yet another embodiment of the present invention uses nickel or nickel compounds (alloys) for the electrochemical plating. Nickel layers are resistant to corrosion, so that the surface of the printed-circuit board does not need to be protected by an additional passivation layer.

It is also beneficial that not only the pads (eyelets) around the bores, but also parts of the printed-circuit boards are covered with the plating. As a result, these parts are also substantially protected from the effects of corrosion.

To improve the soldering process or the bonding of the printed-circuit board, the interconnect traces can preferably be coated with palladium, or the contact lands with a gold layer. As a result, thin bonding wires may also be advantageously used through application of the usual bonding methods, such as nailhead or thermocompression bonding. These bonding wires can then be bonded directly to a corresponding land of an integrated circuit, which is applied as a chip.

DETAILED DESCRIPTION OF THE INVENTION

Figure 1A:
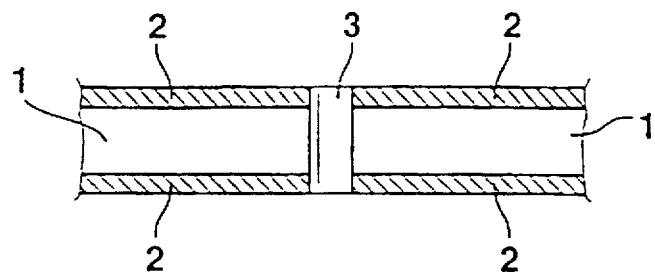
FIGS 1a–1g show sectional views of a first embodiment according to the present invention.
Figure 1B:
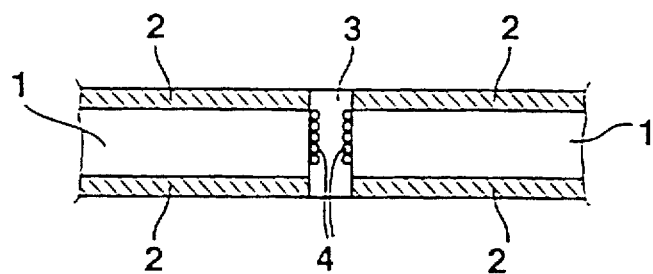
Figure 1C:
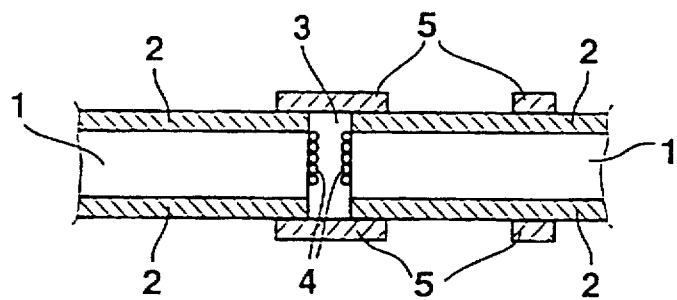
Figure 1D:
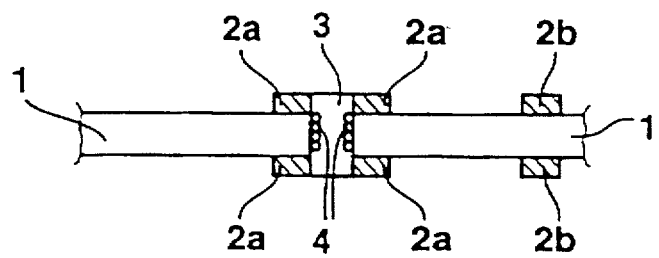
Figure 1E:
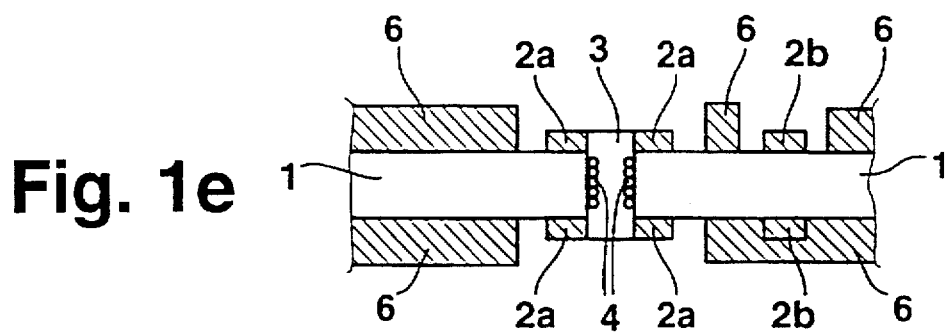

In cross-section, FIGS. 1a–1g show individual stages during the manufacturing of the printed-circuit board. FIG. 1a shows a detail of a printed-circuit board 1 with a vertical bore 3 introduced therein. The printed-circuit board is clad on its top and bottom side with a layer of copper 2. The bores 3 of a specific diameter are introduced at predetermined locations in the copper-clad printed-circuit board 1. In accordance with FIG. 1b, following introduction of the bores 3, the inner wall of the bore 3 is provided with an adhesion promotor. A chemically or galvanically applied thin copper layer having an approximately 3 to 10 micrometer thickness is provided as an adhesion promotor. In an alternative embodiment of the present invention, the inner wall of the bore 3 is coated with a catalyst 4, which effects the later plating of the printed-circuit board and of the bores. The catalyst is stabilized by an annealing process. Preferably, palladium is used as a catalyst. As shown in FIG. 1c, in an appropriate masking step, for example imprinting or lithographic masking, an etch resist layer 5 is applied so as to cover a partial, preferably annular, surface around the bore. On the printed-circuit board 1, the etch protective layer or rather the etch resist layer 5 covers at the same time the bores 3 and also all those spots provided for later formation of the interconnect traces 2b. Following application of the etch resist layer 5, the exposed copper surfaces are etched free in accordance with Figure 1d, and the etch resist 5 is then removed. The pads 2a, the catalyst 4 in the bore 3, as well as the interconnect traces 2b remain as a result. As shown in FIG. 1e, another mask 6 is used to cover the spots of the printed-circuit board 1 which are not supposed to be wetted by the subsequent metallization (metal-coating). In particular, the pads 2a, as well as the interconnect traces 2b to be wetted are left exposed. However, printed-circuit boards can be completely covered, for example on the bottom side in accordance with FIG. 1e, so that they will not be able to be metal-plated.

Figure 1F:
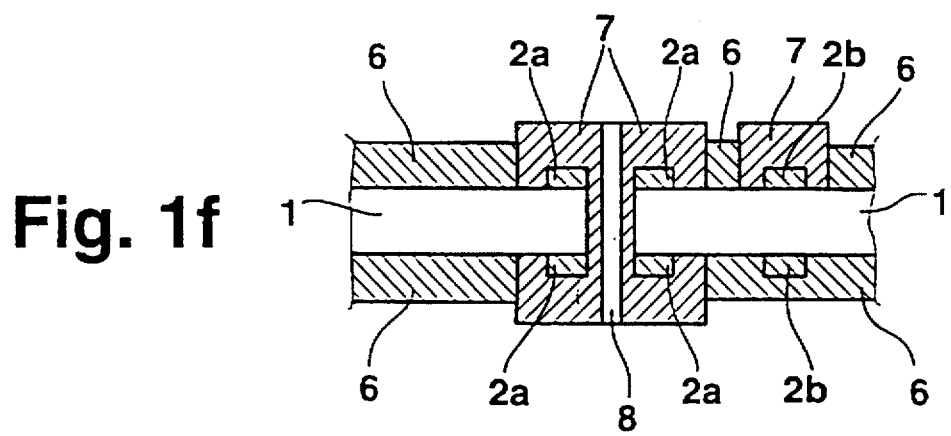
Figure 1G:
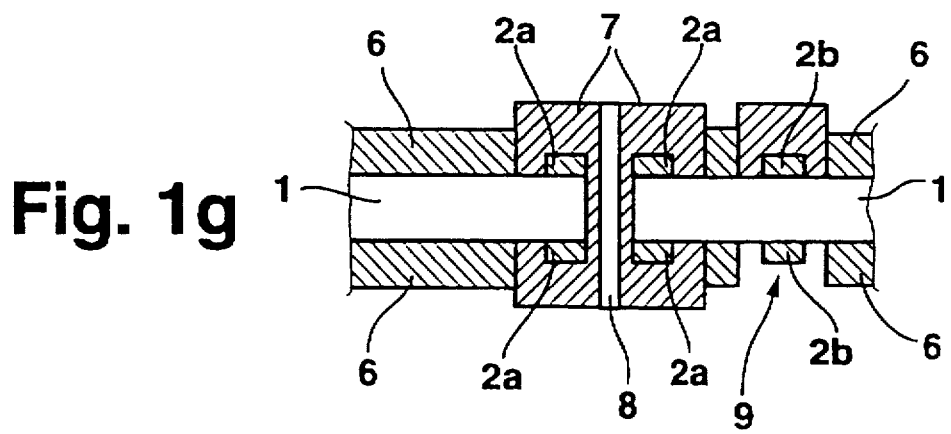

As shown in FIG. 1f, the exposed spots are now plated electrochemically, the metal around the pads 2a forming a continuous bond, particularly in the case of the bores 3, by means of the catalyst 4. The plated bore 8 has a sleeve shape, so that small leads (pins) of a component still requiring mounting can be inserted into the opening. Nickel or nickel compounds are advantageously used for the plating 7 to advantageously protect the plated surfaces from corrosion. As shown in FIG. 1g, another masking step can now be undertaken, in which the unplated interconnect trace or parts of the interconnect trace 2b are coated at the position 9, for example, with a protective layer of palladium or gold. In particular, a thin bonding wire can then be bonded on to these surfaces, the second end of the bonding wire being bonded to a corresponding land on the chip 23 of the integrated circuit (shown in FIG. 3).

For the sake of simplicity, work steps, such as degreasing the surface of the printed-circuit board, re-activating the catalyst, passivation or application of a solder-stop resist, or insertion pressure have been left out.

Figure 2A:
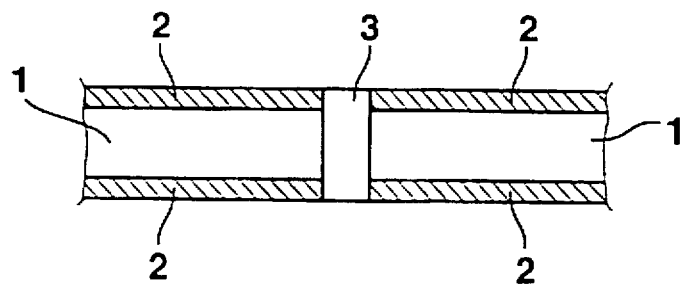
FIGS. 2a–2c show sectional views of a second embodiment according to the present invention.
Figure 2B:
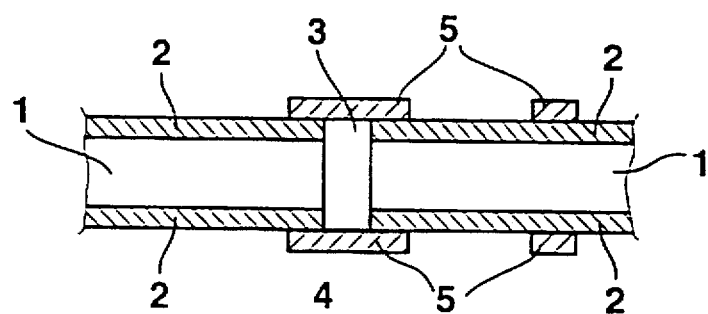
Figure 2C:
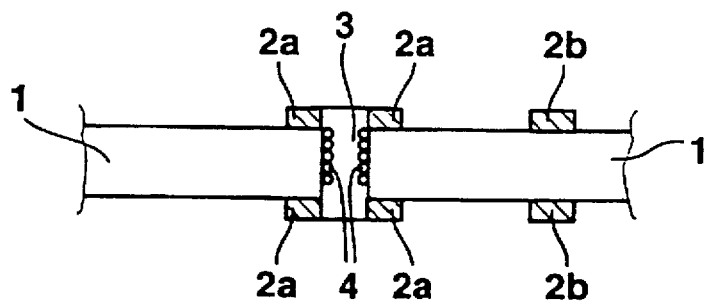

FIGS. 2a–2c show modified work steps of the method of the second embodiment according to the present invention. In FIG. 2a, as in FIG. 1a, a printed-circuit board 1 is coated on two sides and into which one or more bores 3 have been introduced. As shown in FIG. 2b, analogously to FIG. 1c, the bore 3 is now coated with the etch resist 5. As shown in FIG. 2c, after the etching-free step, the pads 2a at the bores 3, as well as the interconnect traces 2b then remain. The catalyst 4 is applied in the next process step to the inner wall of the bore 3. The additional process steps then follow as per the first embodiment as shown in FIGS. 1e, 1f and 1g.

Therefore, the distinguishing feature of the second embodiment according to the present invention is that the catalyst 4 is not introduced into the bores 3 until the pads and the interconnect traces are applied. Accordingly, it is not necessary to re-activate the catalyst 4, since the subsequent process steps can be carried out without a substantial time delay, thus permitting the catalyst 4 to remain effective.

Figure 3:
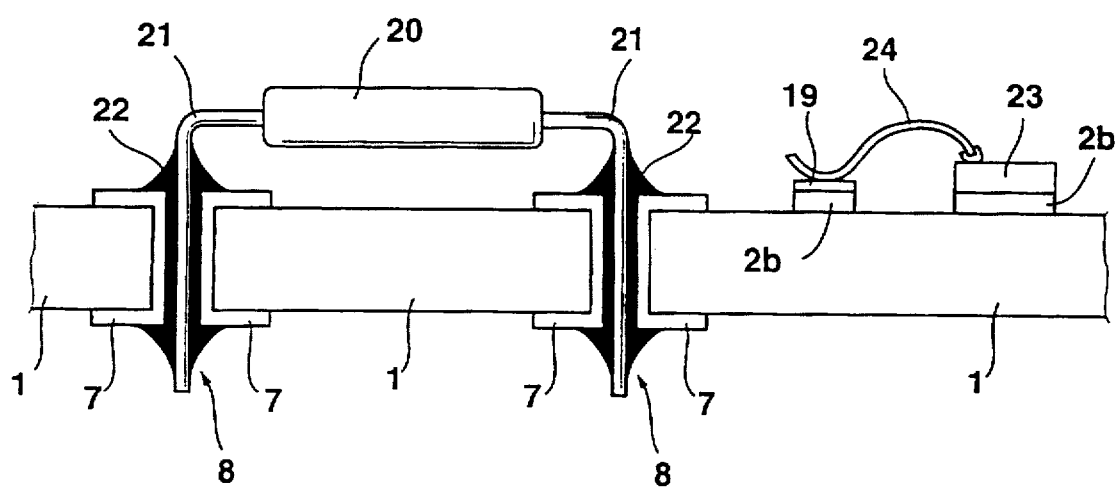
FIG. 3 shows a printed-circuit board with components according to the present invention.

FIG. 3 shows a detail of the printed-circuit board 1 according to the present invention. A component 20 is inserted with its two lead wires 21 into the plated bore 8. In a soldering operation, the lead wires 21 are wetted with solder 22 so as to bond them to the plating 7. In addition, on the printed-circuit board 1, a chip 23 comprising an integrated circuit is placed on one part of an interconnect trace 2b, a land. A bonding wire 24 is led from a contact point of the chip 23 to another interconnect trace 2b, which had previously been coated with a metallic protective layer 19, for example a gold layer. The bonding wire 24 can be bonded to this gold layer using known manufacturing methods.

The individual process steps for producing a contacting are known per se and, therefore, do not require further elucidation.

We claim:

1. A method for producing a plated-through hole on a printed-circuit board having an upper copper-plated surface on an upper side of the board and a lower copper-plated surface on a lower side of the board for forming annular copper surfaces and interconnect traces and bores positioned at predetermined locations, each of the bores having an inner wall, the method comprising the steps, in the order recited, of:

applying an adhesive promoter to the inner wall of each of the bores using an electrochemical deposition process;

applying an annularly shaped etch resist layer to the upper copper-plated surface and the lower copper-plated surface surrounding each of the bores, the etch resist layer at least partially covering each of the bores and the interconnect traces;

etching away uncovered portions of the upper copper-plated surface and the lower copper-plated surface to form the annular copper surfaces and the interconnect traces;

removing the etch resist layer from at least the annular copper surfaces and the bores; and electroconductively coupling the annular copper surfaces to the inner wall of each of the bores with the adhesive promoter using an electrochemical plating.

2. The method according to claim 1, wherein the adhesion promoter includes a catalyst.

3. A method for producing a plated-through hole on a printed-circuit board having an upper copper-plated surface and a lower copper-plated surface for forming annular copper surfaces and interconnect traces, and bores positioned at predetermined locations, each of the bores having an inner wall, the method comprising the steps, in the order recited, of:

applying an annularly shaped etch resist layer to the upper copper-plated surface and the lower copper-plated surface surrounding each of the bores, the etch resist layer at least partially covering each of the bores and the interconnect traces, etching away uncovered portions of the upper copper-plated surface and the lower copper-plated surface to form the annular copper surfaces and the interconnect traces;

removing the etch resist layer from at least the annular copper surfaces and the bores;

applying an adhesive promoter including a catalyst to the inner wall of each of the bores using an electrochemical deposition process; and electroconductively coupling the annular copper surfaces to the inner wall of each of the bores with the adhesive promoter using an electrochemical plating.

4. The method according to claim 1, wherein the adhesion promotor includes one of a chemically applied copper layer or a galvanically applied copper layer, the adhesion promoter having a thickness smaller than 10 µm.

5. The method according to claim 3, wherein the electrochemical plating has a sleeve shape and a thin layer when the electrochemical plating is applied to the inner wall of each of the bores.

6. The method according to claim 1, wherein the electrochemical plating has one of a nickel composition and a nickel alloy composition.

7. The method according to claim 1, wherein the interconnect traces include predetermined members, the predetermined members being covered with the electrochemical plating.

8. The method according to claim 1, wherein the interconnect traces include predetermined members, the predetermined parts being covered with a protective layer, the protective layer having one of a palladium composition and a gold composition.

9. The method according to claim 8, further comprising the step of:

electrically coupling bonding wires to a semiconductor chip on the protective layer.

* * * * *